United States Patent
Taylor et al.

(10) Patent No.: US 9,346,219 B2
(45) Date of Patent: May 24, 2016

(54) MANUFACTURING PROCESS FOR 3D PRINTED OBJECTS

(71) Applicant: MAKIEWORLD LIMITED, London (GB)

(72) Inventors: Alice Taylor, London (GB); Luke Petre, London (GB); Joanna Roach, London (GB); Sulka Haro, London (GB)

(73) Assignee: MAKIEWORLD LIMITED, London (GB)

( * ) Notice: Subject to any disclaimer, the term of this patent is extended or adjusted under 35 U.S.C. 154(b) by 0 days.

(21) Appl. No.: 14/326,988

(22) Filed: Jul. 9, 2014

(65) Prior Publication Data

US 2014/0336808 A1    Nov. 13, 2014

(30) Foreign Application Priority Data

May 9, 2013 (GB) ................... 1308343.1

(51) Int. Cl.
     *B29C 67/00*      (2006.01)
     *G06F 17/50*      (2006.01)
     *B33Y 50/00*      (2015.01)

(52) U.S. Cl.
     CPC ............. *B29C 67/0088* (2013.01); *B33Y 50/00* (2014.12); *G06F 17/50* (2013.01)

(58) Field of Classification Search
     CPC ........... B29C 67/0092; B29C 67/0051; B29C 67/0088; G06F 17/50; G06F 2203/04802; G06F 17/5018; B33Y 50/00
     USPC .................. 700/98, 119; 715/744, 765, 826; 345/420
     See application file for complete search history.

(56) References Cited

U.S. PATENT DOCUMENTS

| | | | | |
|---|---|---|---|---|
| 5,557,527 | A * | 9/1996 | Kotaki et al. | 700/131 |
| 6,271,856 | B1 * | 8/2001 | Krishnamurthy | 345/581 |
| 6,762,757 | B1 * | 7/2004 | Sander et al. | 345/420 |
| 6,862,374 | B1 * | 3/2005 | Nagai et al. | 382/285 |
| 7,075,531 | B1 * | 7/2006 | Ando et al. | 345/420 |
| 7,079,114 | B1 | 7/2006 | Smith et al. | |
| 7,391,420 | B1 * | 6/2008 | Coyne | 345/473 |
| 8,139,068 | B2 * | 3/2012 | Isner et al. | 345/474 |

(Continued)

FOREIGN PATENT DOCUMENTS

| | | | | |
|---|---|---|---|---|
| EP | 1077431 | * | 8/1999 | ............... G06T 17/20 |
| GB | 2389764 | * | 12/2003 | ............... G06T 7/40 |
| WO | WO 2009/128898 A1 | | 10/2009 | |

OTHER PUBLICATIONS

Pixar, "OpenSubdiv Architecture", Dec. 4, 2012, pp. 2.*

(Continued)

*Primary Examiner* — Carlos Ortiz Rodriguez
*Assistant Examiner* — Olvin Lopez Alvarez
(74) *Attorney, Agent, or Firm* — Nixon & Vanderhye PC

(57) ABSTRACT

The present invention relates to a computer-implemented method of manufacturing customized 3D objects. The method includes retrieving a source model for a 3D object and a plurality of defined control points for the 3D object from a database; receiving modifications to at least some of the control points from a first user; automatically applying the modifications to the source model to create a modified model; and automatically generating print instructions for manufacture of a customized version of the 3D object. A system and 3D models generated by the method are also disclosed.

21 Claims, 9 Drawing Sheets

(56) References Cited

U.S. PATENT DOCUMENTS

| | | | |
|---|---|---|---|
| 8,174,539 B1* | 5/2012 | Samaniego et al. | 345/619 |
| 8,266,546 B2* | 9/2012 | Candrian et al. | 715/815 |
| 8,314,790 B1* | 11/2012 | Zeiger et al. | 345/419 |
| 8,515,826 B2* | 8/2013 | Norman | 705/26.5 |
| 8,654,121 B1* | 2/2014 | Yu et al. | 345/423 |
| 8,730,231 B2* | 5/2014 | Snoddy et al. | 345/419 |
| 8,791,942 B2* | 7/2014 | Rivers et al. | 345/419 |
| 2001/0056308 A1* | 12/2001 | Petrov et al. | 700/98 |
| 2003/0074174 A1 | 4/2003 | Fu et al. | |
| 2003/0201992 A1 | 10/2003 | Wang et al. | |
| 2004/0157527 A1* | 8/2004 | Omar | 446/268 |
| 2006/0023228 A1* | 2/2006 | Geng | 356/601 |
| 2006/0023923 A1* | 2/2006 | Geng et al. | 382/116 |
| 2006/0098008 A1* | 5/2006 | Holberg | 345/420 |
| 2007/0011982 A1* | 1/2007 | Swift | 52/604 |
| 2007/0198118 A1* | 8/2007 | Lind | 700/138 |
| 2007/0198230 A1 | 8/2007 | Wang et al. | |
| 2007/0273711 A1* | 11/2007 | Maffei | 345/630 |
| 2008/0006273 A1* | 1/2008 | Thornton | 128/206.21 |
| 2008/0111816 A1* | 5/2008 | Abraham et al. | 345/420 |
| 2010/0305909 A1* | 12/2010 | Wolper et al. | 703/1 |
| 2011/0060438 A1* | 3/2011 | Stoddard et al. | 700/98 |
| 2011/0234581 A1* | 9/2011 | Eikelis et al. | 345/419 |
| 2011/0298897 A1* | 12/2011 | Sareen et al. | 348/47 |
| 2012/0079378 A1* | 3/2012 | Goossens | 715/706 |
| 2012/0224755 A1* | 9/2012 | Wu | 382/131 |
| 2012/0255663 A1* | 10/2012 | Holroyd et al. | 156/64 |
| 2012/0314021 A1* | 12/2012 | Tsang | 348/40 |
| 2013/0046511 A1* | 2/2013 | Tayal et al. | 703/1 |
| 2013/0096708 A1* | 4/2013 | Danks | B29C 67/0088 700/98 |
| 2013/0159866 A1* | 6/2013 | Dirsa et al. | 715/738 |
| 2014/0074272 A1* | 3/2014 | Cowden, IV | 700/97 |
| 2014/0092090 A1* | 4/2014 | Fleury | 345/420 |
| 2014/0163710 A1* | 6/2014 | Moreau | 700/98 |
| 2014/0184599 A1* | 7/2014 | Quilot et al. | 345/423 |
| 2014/0274458 A1* | 9/2014 | Kronenberg et al. | 473/342 |
| 2014/0279177 A1* | 9/2014 | Stump | 705/26.4 |
| 2014/0337779 A1* | 11/2014 | Davis et al. | 715/771 |

OTHER PUBLICATIONS

Youtube.com, "meet the makies custom 3D printed dolls", Sep. 1, 2014, pp. 1.*

Lai et al, "Feature aligned quad dominant remeshing using iterative local updates", 2009, pp. 109-117.*

Guthe et al, "GPU-based trimming and tessellation of NURBS and T-Spline surfaces", Jul. 2005, pp. 1016-1023.*

Niebner et al, "Feature Adaptive GPU Rendering of Catmull-Clark Subdivision Surfaces", 2012, pp. 1-11.*

Autodesk, "autodesk MAya, Subdivision Surface Modeling", 2011, pp. 68.*

De Rose et al, "Subdivision Surfaces in Character Animation", Oct. 19, 2003, pp. 10.* sculpteo.com, "Prepare your model for 3D Printing", ttp://www.sculpteo.com/en/prepare-your-model-3d-printing, pp. 2, downloaded May 2015.* sculpteo.com, "Prepare your model for 3D Printing with Inventor", http://www.sculpteo.com/en/prepare-your-model-3d-printing-inventor/, available Online 2014, pp. 9.*

Donley, "Best 3D Printing Plugins for Sketchup", Jul. 30, 2013, pp. 6.*

Pereira et al, "Boolean operations on multi-region solids for mesh generation", Jun. 28, 2011, pp. 15.*

Cantwell, "Find holes in your Sketchup mesh easily with the Solid Inspector plugin", www.ponoko.com, Aug. 7, 2011, pp. 1.*

Shapeways.com, "SketchUp STL export tutorial", Mar. 5, 2013, pp. 10.*

Ritland, "8 Tips for 3D Printing with Sketchup", http://mastersketchup.com/8-tips-for-3d-printing-with-sketchup/, Oct. 2012, pp. 6.*

Arruda et al, "Boolean Operations on Non-Manifold and B-Rep Solids for Mesh Generation", 2006, pp. 19.*

Search Report mailed Oct. 21, 2014 in Great Britain Application No. 1308343.1 (4 pages).

* cited by examiner

MANUFACTURING PROCESS FOR 3D PRINTED OBJECTS

This application claims priority to GB Application No. 1308343.1, filed on May 9, 2013, the entire contents of which is incorporated herein by reference.

FIELD OF INVENTION

The present invention is in the field of manufacturing of 3D printed objects. In particular, but not exclusively, the present invention relates to the manufacturing of customisable 3D printed objects.

BACKGROUND

Small batch manufacturing of objects has become more viable with the development of 3D printing, or additive manufacturing, where a printing apparatus layers substrate to build up a 3D object.

In light of such manufacturing techniques, it would be desirable to generate very small batch or one-off designs. However, to create the instructions for a 3D printer to create a 3D object requires knowledge and expertise in 3D modelling software.

One method to enable consumers to create unique objects is to construct a service to permit them to customise existing models.

The consumer can instruct the service to make certain modifications to existing models which can be implemented by designers using 3D modelling software.

Clearly this methodology involves significant human input by skilled 3D modellers. The methodology cannot simply be automated due to the skill required by the 3D modellers. Therefore, a new manufacturing process is desired which manufactures 3D objects customised by users.

It is an object of the present invention to provide a 3D object manufacturing method which overcomes the disadvantages of the prior art, or at least provides a useful alternative.

SUMMARY OF INVENTION

According to a first aspect of the invention there is provided a computer-implemented method of manufacturing 3D objects, including:

a) retrieving a source model for a 3D object and a plurality of defined control points for the 3D object from a database;

b) receiving modifications to at least some of the control points from a first user;

c) automatically applying the modifications to the source model to create a modified model; and e) automatically generating print instructions for manufacture of a customised version of the 3D object.

The method may also include the step of automatically subdividing the surface of the modified model to create a high resolution model which is used to generate the print instructions.

The print instructions may be generated by a layer renderer using the modified model or high resolution model.

The method may also include the step of automatically controlling a 3D printer using the print instructions.

The source model may comprise a shell portion and an internal components portion. The control points may relate to aspects of the shell portion. The shell portion may comprise at least one low resolution mesh and the internal components portion may comprise at least one high resolution mesh. The method may include the step of modifying the high resolution model by combining it with the internal components portion.

The shell portion may also comprise an exterior surface mesh and an interior surface mesh. Modifications may be applied to each of the exterior and interior surface meshes. The exterior and interior surface meshes may be combined after the modifications are applied.

A stereo-lithography check may be generated on the high resolution model.

The high resolution model and the source model may be displayed to a second user for quality control purposes, for example.

The modifications may be delimited by constraints defined within the source model.

A low resolution representation of the source model may be displayed within a graphical user interface to the first user. Customisations may be received from the first user via the graphical user interface. The customisations may be converted into modifications of the control points. The customisations may relate one or more within a set of physical features of the source model.

According to a further aspect of the invention there is provided a system for manufacturing 3D objects, including:

Processing circuitry configured for receiving modifications to control points for a source model from a user device, applying the modifications to the source model to generate a modified model, and rendering print instructions from the modified model;

Storage circuitry configured for storing and retrieving a plurality of source models and associated control points within a database; and A control unit configured for controlling a 3D printer to create a 3D object from the print instructions.

The processing circuitry may be further configured to subdivide the modified model to generate a processing model from which the print instructions may be generated.

The print instructions may be generated using a layer renderer.

The system may include a database configured for storing the plurality of source models and associated control points and a communications circuitry. The processing circuitry may be further configured to transmit a representation of the source model and the control points to the user device via the communications circuitry.

Other aspects of the invention are described within the claims.

BRIEF DESCRIPTION OF THE DRAWINGS

Embodiments of the invention will now be described, by way of example only, with reference to the accompanying drawings in which.

DETAILED DESCRIPTION OF PREFERRED EMBODIMENTS

The present invention provides a manufacturing process for 3D objects.

Figure 1:
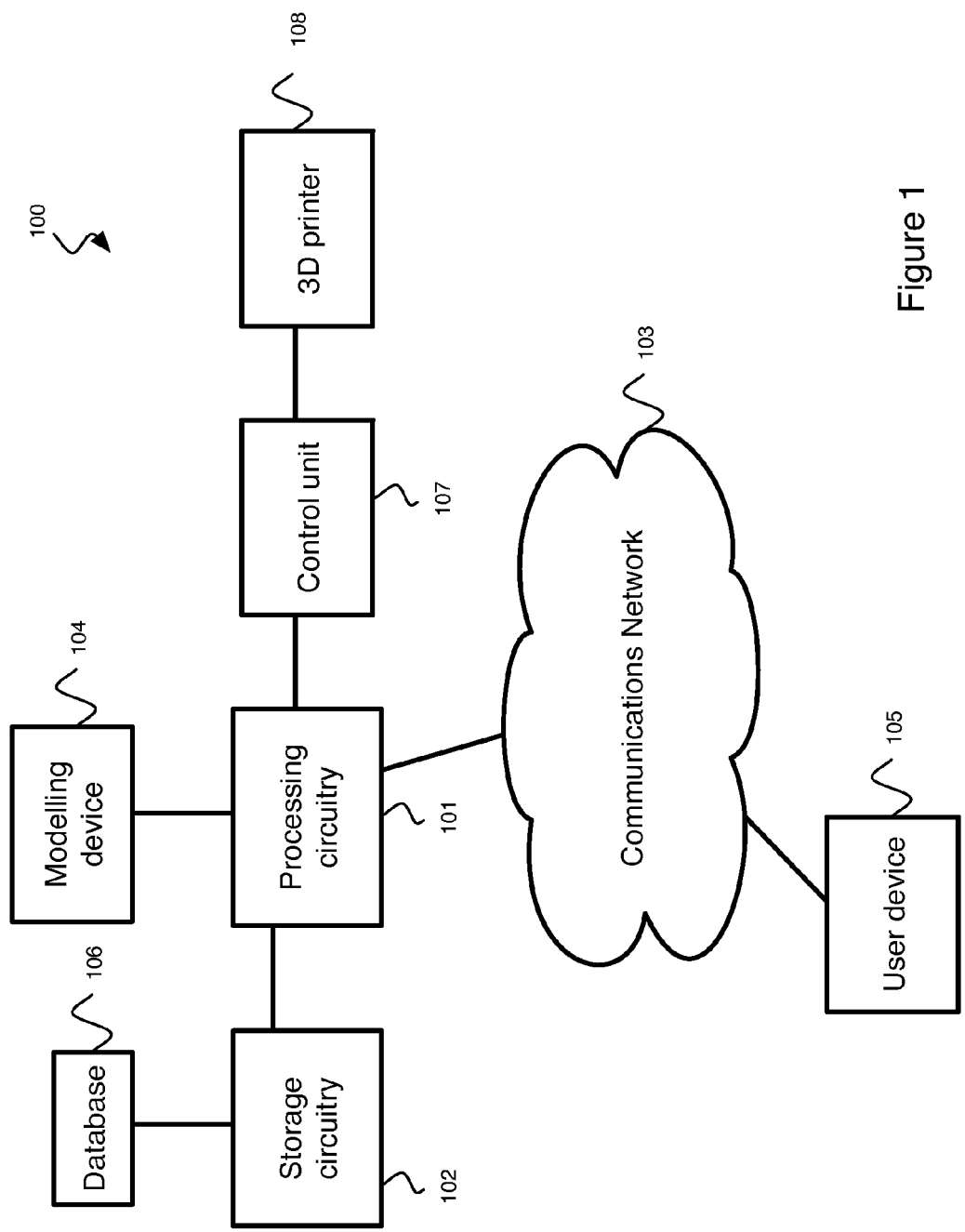
FIG. 1: shows a block diagram illustrating a system in accordance with an embodiment of the invention.

Referring to FIG. 1, a system 100 for manufacturing 3D objects will be described.

The system 100 may comprise processing circuitry 101 and storage circuitry 102. The circuitry 101 and 102 may be collocated at a server. It will be appreciated that the processing and storage circuitry 101 and 102 may be distributed across a plurality of physical hardware components which may be collocated or connected by one or more communications networks 103.

A modelling device 104 is shown. The modelling device 104 may be a computing device comprising a processor, a memory, an input and an output. The device 104 may be configured for use by a user, such as a designer, to construct a source model and to define within the source model a plurality of control points. The source model and list of control points may be transmitted to the processing circuitry 101.

The source model is preferably comprised of a series of interconnected polygons (a source mesh). The source mesh may be defined as a series of instructions specifying the vertices of the polygons. The control points may relate to specific vertices of the mesh.

The source model may comprise an exterior surface mesh and an interior surface mesh.

The source model may further comprise internal components. The exterior and interior meshes may be created at a first level of resolution and the internal components may be created at a second level of resolution higher than the first.

Another user, such as a consumer who may be unskilled in 3D modelling, may access a representation of the source model using a user device 105. The representation of the source model may comprise only the exterior mesh. The representation of the source model may be generated from the source model by the processing circuitry 101 and transmitted to the user device 105 via a communications network 103. In an alternative embodiment, the representation of the source model may be generated at the user device 105. The user device 105 may be a computing device such as a personal computer, a laptop, a smart-phone, or a tablet computer. The communications network 103 may be the Internet, a cellular network, a LAN, or a combination of networks.

The source model and list of control points may be stored in and retrieved from a database 106 by a storage circuitry. It will be appreciated that the database 106 may distributed across a plurality of physical hardware.

The user device 105 may be configured to receive input from the user to modify the control points defined for the source model and to transmit the modified control points to the processing circuitry.

The processing circuitry 101 may be configured to apply the modifications to the source model to generate a modified model.

The processing circuitry 101 may apply the modifications by shifting the vertices within the meshes to correspond to the modified control points. Both the exterior and interior surface meshes may be modified.

The processing circuitry 101 may be further configured to process the modified model to subdivide the polygons within the source model. The polygons may be subdivided using an algorithmic subdivision method such as opensubdiv. The subdivision will result in a greater set of instructions and the resulting model will be of a higher 3D resolution. Where the source model comprises an exterior and interior surface mesh at a first resolution and internal components at a higher resolution, the polygons within the surface meshes may be subdivided.

The processing circuitry 101 may also be configured to apply a layer rendering process to the processed model to generate a set of print instructions. The print instructions will define how the processed model may be printed using an additive manufacturing method. The layer renderer may be configured to define different processed models based upon the type of recipient 3D printer.

The print instructions may be transmitted to a control unit 107 which controls the printing of a 3D object on a 3D printer 108.

Figure 2:
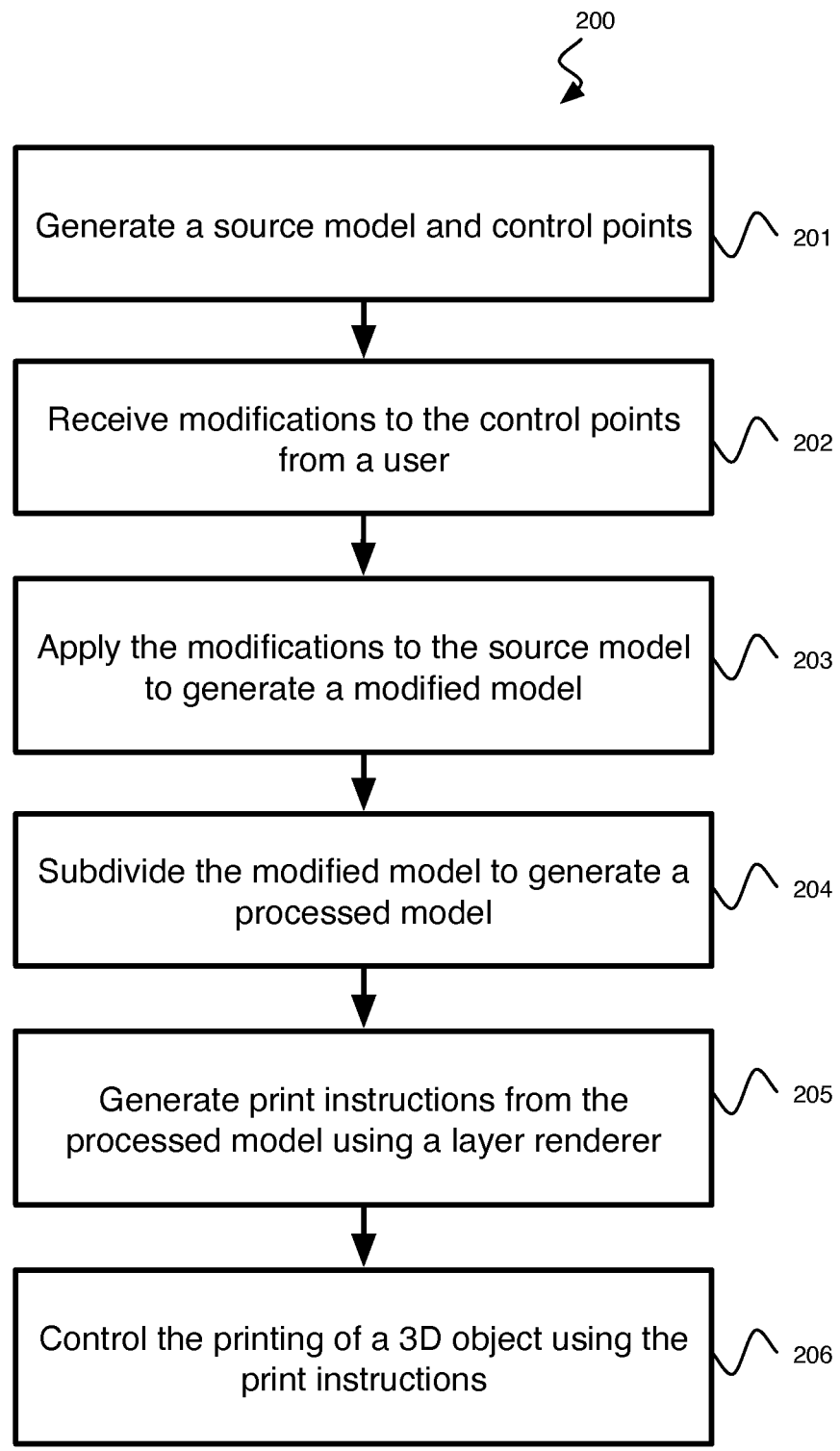
FIG. 2: shows a flowchart illustrating a system in accordance with an embodiment of the invention.

Referring to FIG. 2, a method 200 of 3D manufacturing will be described.

In step 201, a source model is generated and a series of control points (or morph targets) are defined. The source model defines a specific type of customisable 3D object. The control points define the customisability of the 3D object. Alternatively, the generated source model and control points may be retrieved by the processing circuitry 101 from a database 106.

The source model may comprise two parts as previously discussed:

a) a shell; and
b) internal components.

The shell of the object may be modelled and then exported for use by a designer user. The shell may built to allow for algorithmic subdivision, in order to provide a lower level of detail to facilitate lower bandwidth transmission to a consumer's user device and to enable lower-powered devices to render the shape, and to facilitate higher levels of detail in a final solid shape suitable for 3D printing. In one embodiment, a Catmull-Clark subdivision algorithm is used and 4-sided polygons are used where possible to accommodate that algorithm.

The internal components may be modelled by a designer user to be used within the shell in a physical version of the object. These do not need to be displayed to the consumer user as part of the shell, so can be created with a high polygon count.

Figure 3:
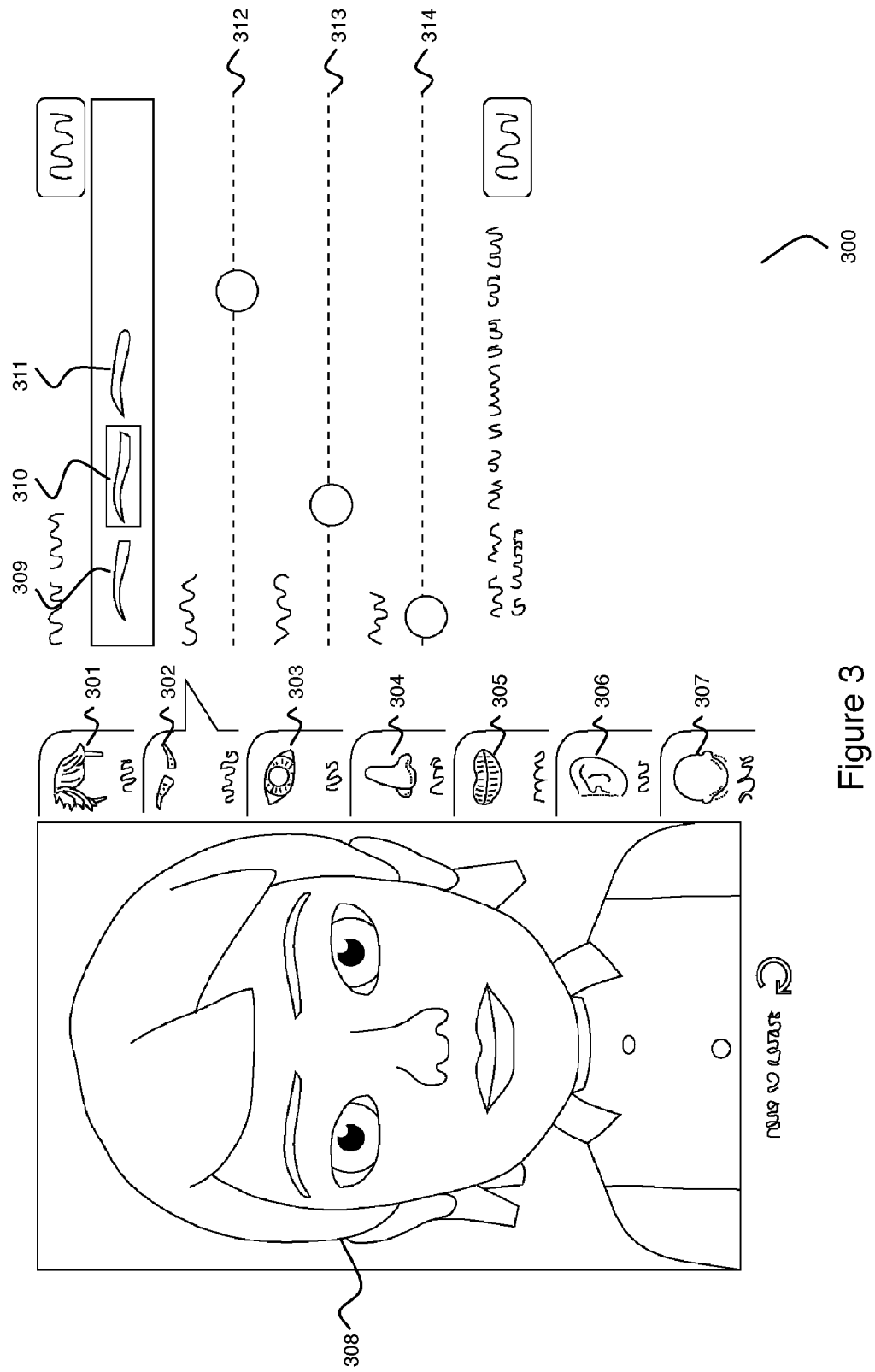
FIG. 3: shows a user interface for a model customisation system.

In step 202, modifications to the control points of the source model are received. The modifications may be received from the user device of a consumer user. A graphical user interface (such as shown in FIG. 3) may display the exterior shell of the object to the consumer user. The consumer user may also be provided with input controls within the graphical user interface. The input controls may provide the ability for the consumer user to adjust features of the object. Adjustments to the features may be converted into modifications to the control points of the object.

In step 203, the modifications are applied to the source model to generate a modified model.

The shell of the source model may comprise an exterior and interior mesh.

The interior mesh is adjusted to match the exterior mesh by applying the same set of modifications or "morph data" to the internal mesh as are applied to the exterior mesh. The internal mesh may interpret these modifications differently (e.g. the morph data may affect different areas of the mesh, or have no effect if required). The designer user may configure the application of the modifications to the exterior and interior meshes.

After the modifications have been applied, the exterior mesh is combined with the interior mesh to form a solid by perform a boolean operation, such as intersection, on the meshes.

In step 204, the modified model is subdivided to generate a processed model. For example, the polygon count of the solid may be programmatically increased during subdivision using, for example, subdivision of the polygons (such as opensubdiv).

The solid may then be combined with the internal components by performing a boolean operation, such as union, on the solid and internal component meshes. In some embodiments, specific Boolean operations may be defined for each internal component.

In one embodiment, the positioning of the internal components may be modified by the modifications to the control points of the source model. In this embodiment, constraint information may be included for the internal components within the source model.

For example, constraint data attached to specific external features, and constraint data defined on the model as a whole, may be used to programmatically place and modify the internal components. It may use metadata attached to features and the model, and custom code to parse and interpret that metadata, using it to define and apply a set of move and morph operations to be applied to the internal components(s) (so that, for example, the resulting solid model skin were of the right thickness, and internal components were of the right size and shape).

A STL (StereoLithography) check operation may be attached to the solid mesh before saving. This check allows the software to verify that the solid has a complete and closed surface, which will be required if the solid is going to be sent to an additive manufacturing machine. The check operation can be executed automatically or manually.

In step 205, the processed model is further processed using a layer renderer to generate print instructions for the 3D object. The layer renderer may chain together the component parts of the processed model to facilitate efficient manufacturing.

In step 206, a 3D printer may be controlled using the print instructions to create the physical 3D object.

In one embodiment, after the processed model has been generated, it may be displayed next to the source model to a user to enable the user to make a quality control assessment.

In one embodiment, the processed model may be verified to ensure that a resulting solid has a complete and closed surface for physical printing.

FIG. 3 shows a user interface 300 configured to receive input from a user to adjust features 301 to 307 of a 3D model 308. In one embodiment, once the user selects a particular feature 302, several predefined options 309, 310, or 311 for the feature are available for the user to select. In an alternative embodiment, only a single predefined option is provide.

The predefined options 309 to 311 may correlate to predefined modifications to a subset of the control points. In one embodiment, the subset of the control points is the same for each option. In one embodiment, the subsets of the control points for each feature comprise at least one common control point across at least some subsets.

One or more adjustment means 312 to 314 may be provided to receive input from the user to the selected option 310. The adjustment means may be a virtual scroll-bar, a virtual wheel, a physical slider or switch, or another abstract input device configured to receive input from a user within a defined range.

The adjustment means may, alternatively, comprise the receipt of user input via a pointer device or touch-screen directly to a representation of the 3D model.

In the user interface shown, the adjustments are converted into modifications to control points.

The user interface may comprise a representation of the 3D model. The representation may reflect modifications to the 3D model made in response to the user input.

Figure 4:
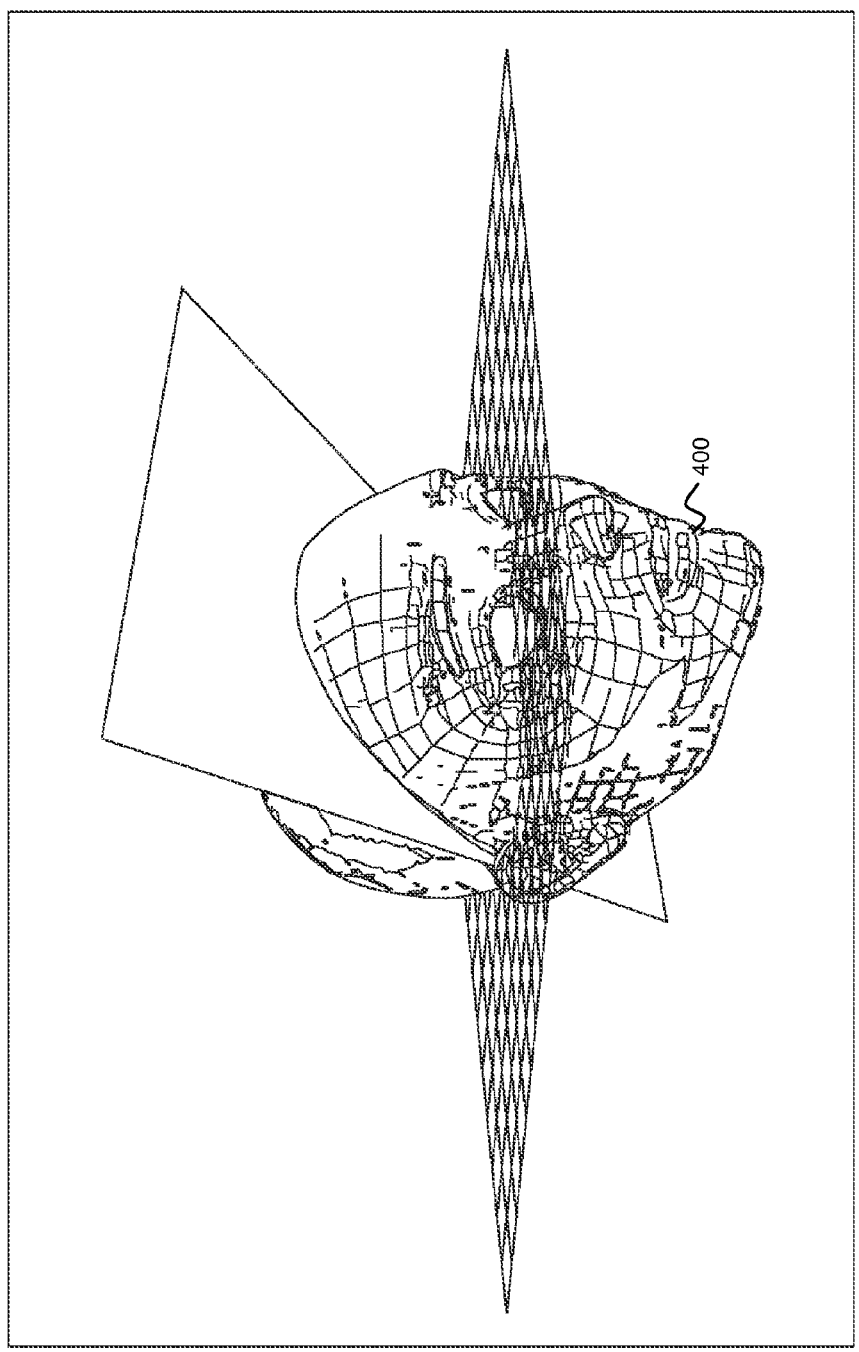
FIG. 4: shows a 3D model before modifications or subdivision has occurred.

FIG. 4 shows a 3D model 400 that may be modified in accordance with the present invention.

Figure 5:
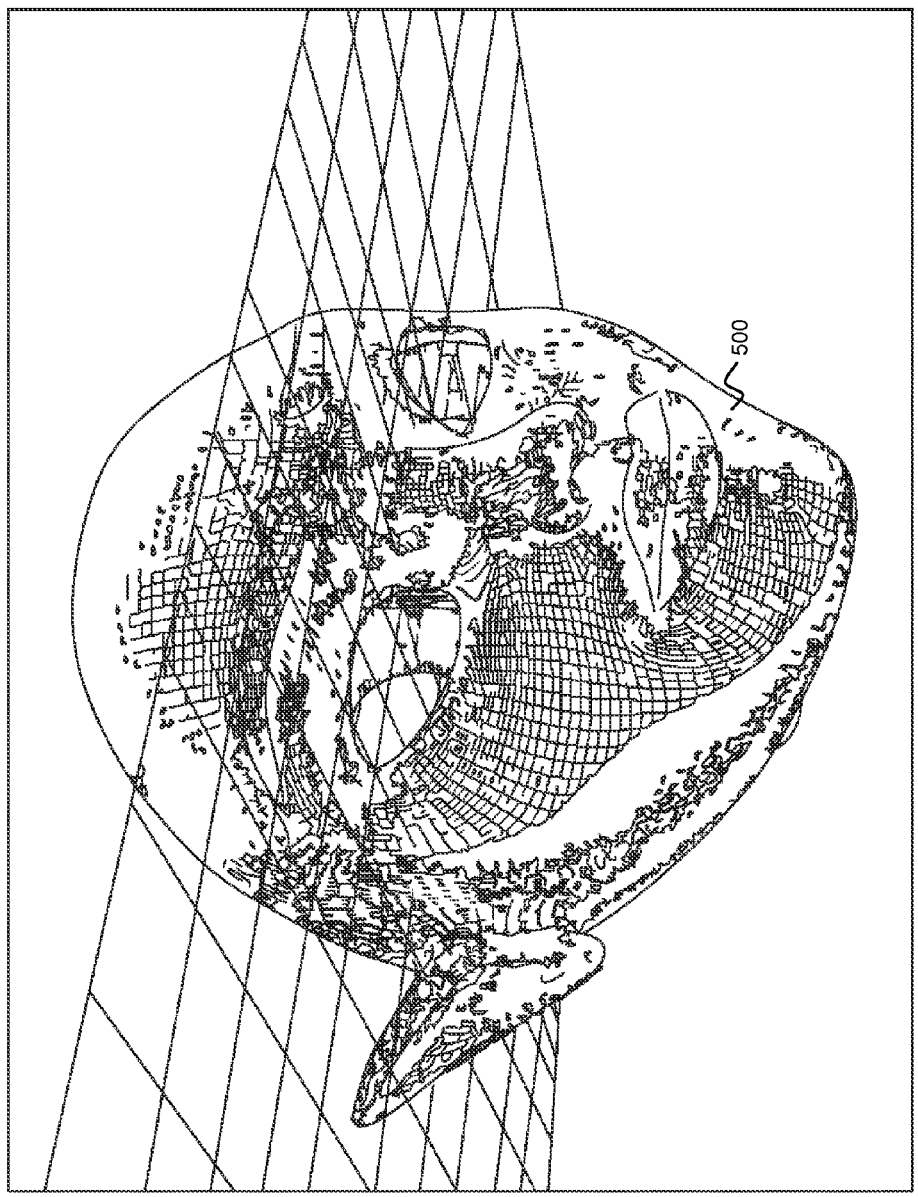
FIG. 5: shows a 3D model after modifications and subdivision has been applied in accordance with an embodiment of the invention.

FIG. 5 shows a 3D model 500 that corresponds to 3D model 400 to which modifications have been automatically applied and then which has been subdivided.

Figure 6:
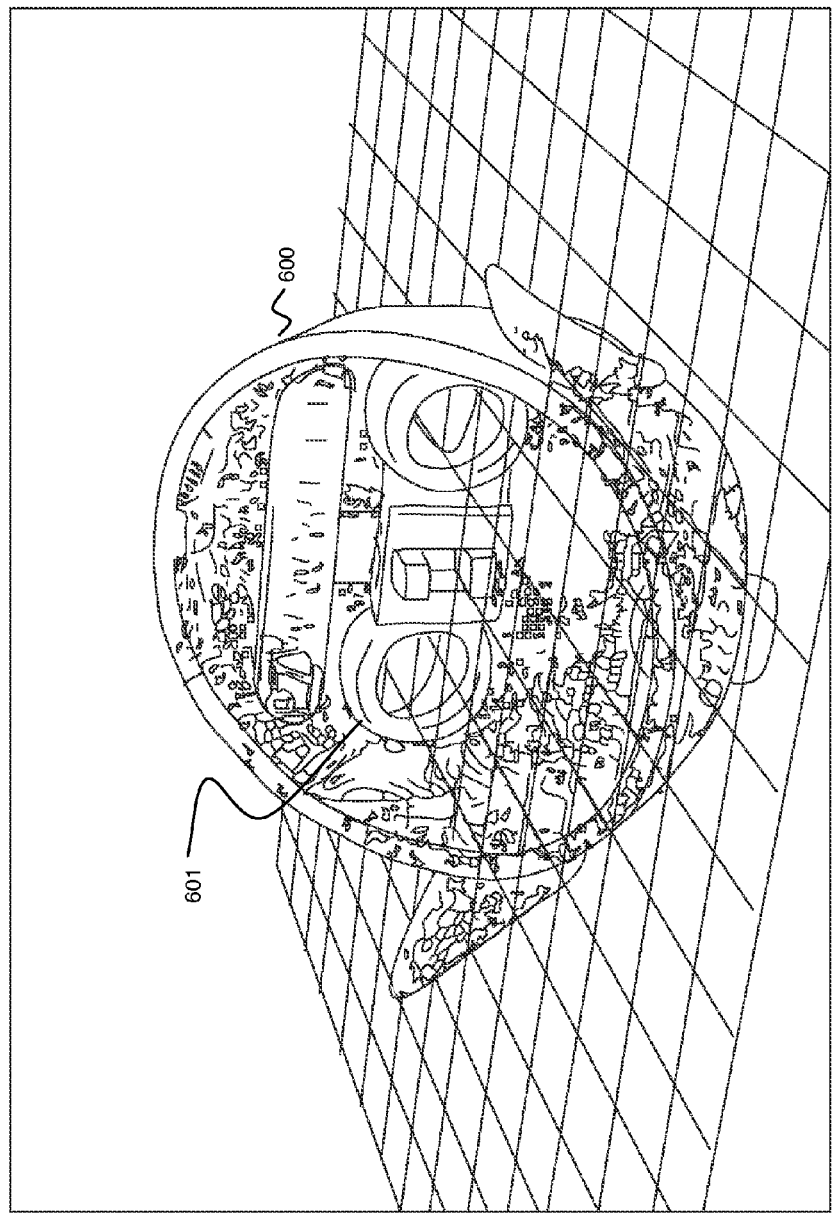
FIG. 6: shows a 3D model after combination of the modified and subdivided shell portion with the internal components portion of the model in accordance with an embodiment of the invention.

FIG. 6 shows a 3D model 600 that corresponds to 3D model 500 which has been combined with the internal components portion 601.

Figure 7:
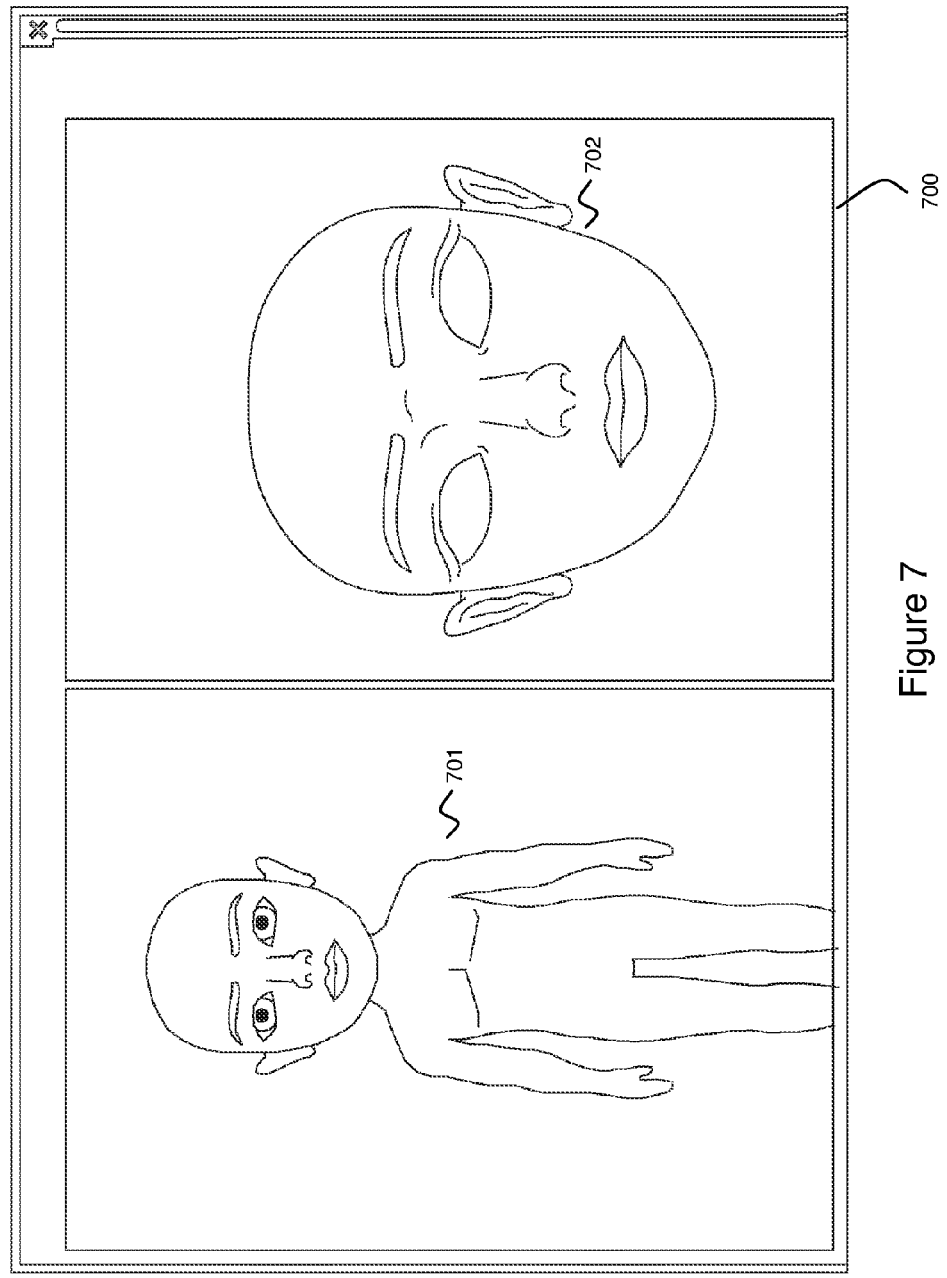
FIG. 7: shows a graphical display of the 3D models in accordance with an embodiment of the invention.

FIG. 7 shows a graphical display 700 of both a representation 701 of a low resolution, modified 3D model and a representation 702 of a subdivided, and therefore, high resolution modified 3D model. This graphical display 700 may be generated and displayed to a second user for quality control purposes before the physical model is printed.

Figure 8:
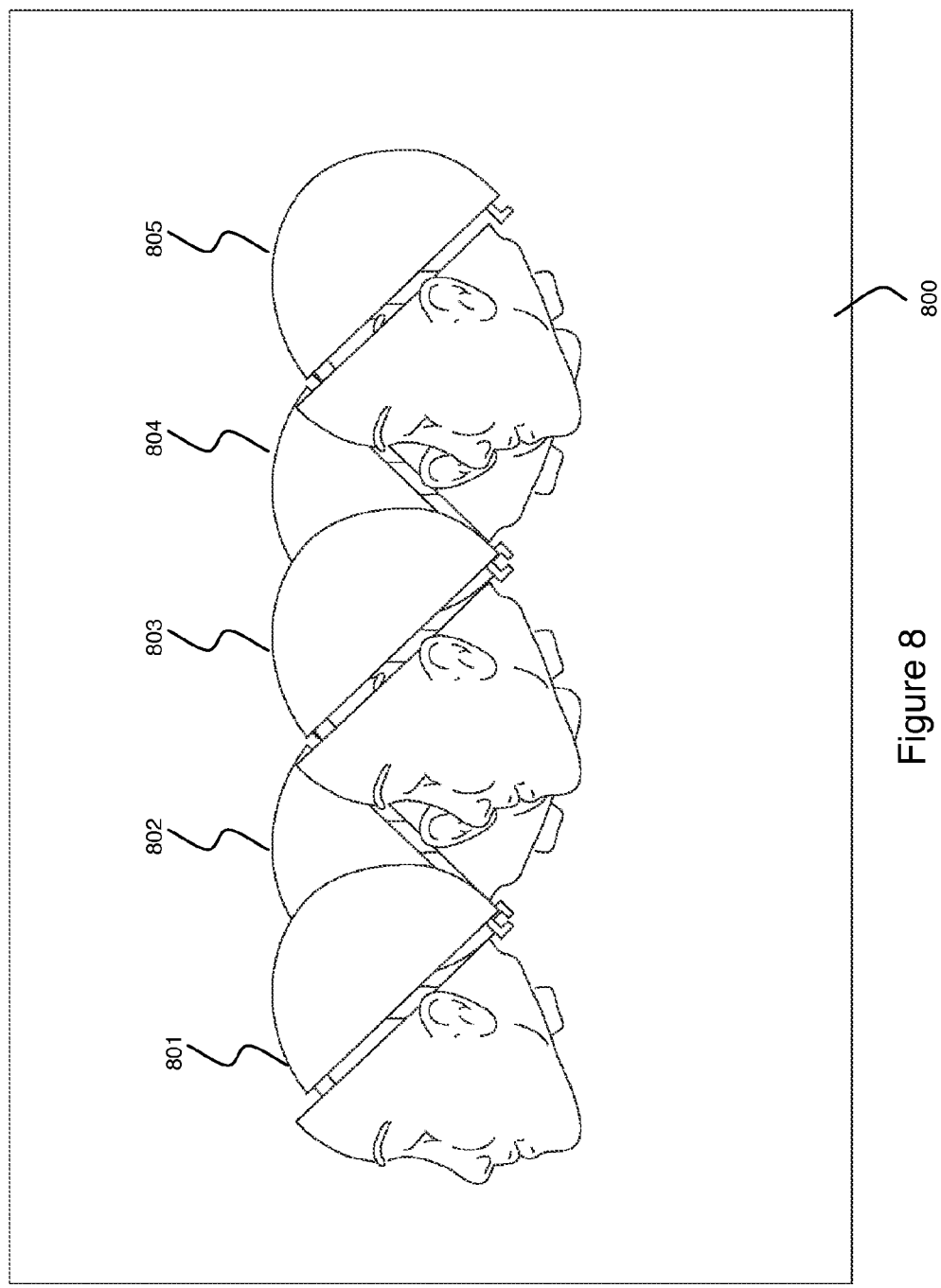
FIGS. 8 and 9: show representations of a print layout for multiple 3D models generated by a layer renderer.

FIG. 8 shows a layer renderer output 800 which combines multiple customised 3D models 801 to 805 laid out together into a print layout suitable for 3D printing.

The print instructions may be generated from the print layout.

Figure 9:
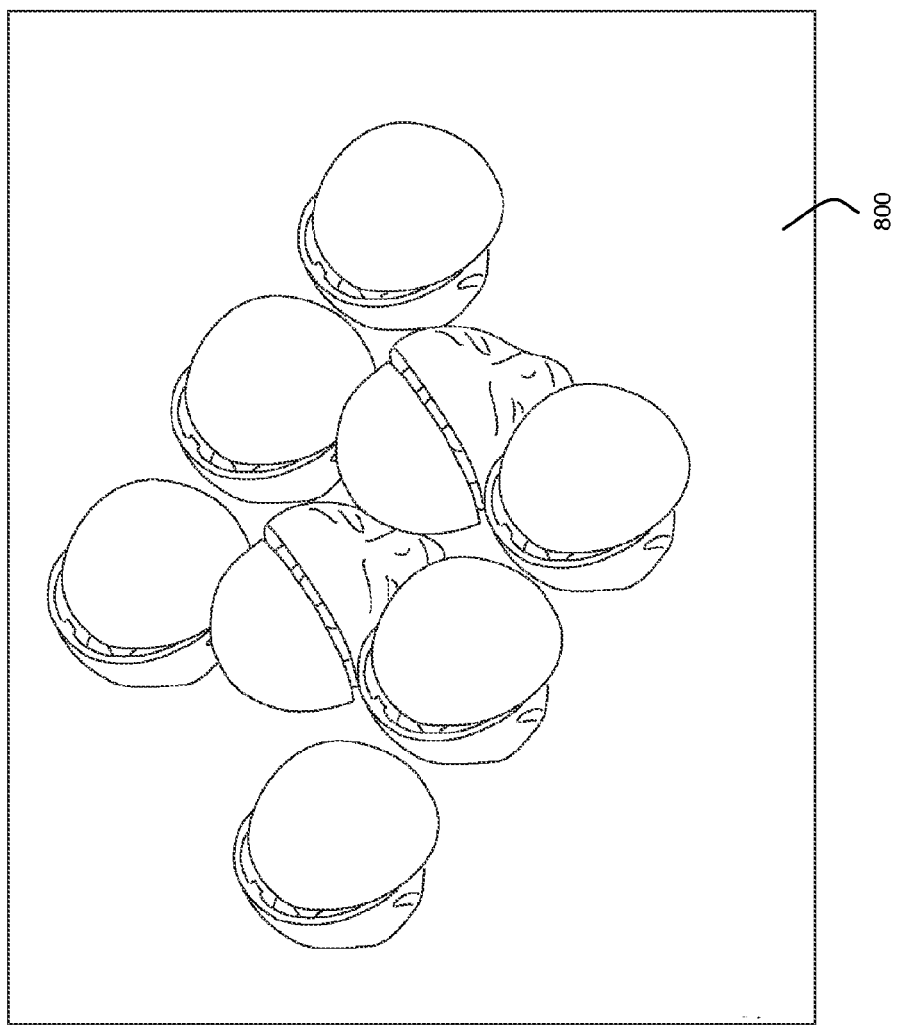

FIG. 9 shows a 3D representation of the layer renderer output 800.

It will be appreciated that the method of the invention may be implemented within hardware or may be defined within software.

A potential advantage of some embodiments of the present invention is that unskilled users can create unique 3D objects. A further potential advantage is that because the process is deterministic, the same 3D object can be printed from the same source model using the same modifications. A further potential advantage is that because 3D printers have physical limitations, the source model, defined control points, and processing methodology restrict the generation of user-modified 3D models to physically possible models suitable for physical printing.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departure from the spirit or scope of applicant's general inventive concept.

The invention claimed is:

1. A computer-implemented method of manufacturing 3D objects, including:
   a) processing circuitry at a server retrieving, from a database, a source model comprising a shell portion and an internal components portion for a 3D object and a plurality of defined control points relating to aspects of the shell portion for the 3D object, wherein the shell portion comprises a low resolution exterior surface mesh including a series of interconnected polygons with the control points relating to vertices of the exterior surface mesh and the internal components portion comprises at least one high resolution mesh having a higher polygon count than the low resolution exterior surface mesh;

b) transmitting the low resolution exterior surface mesh of the shell portion and the control points relating to aspects of the shell portion from the server to a user device;

c) displaying a representation model of the received low resolution exterior surface mesh on a display associated with the user device;

d) receiving, via a graphical user interface provided on the user device, user specified modifications to at least some of the control points, wherein the user specified modifications are correlated to one or more selected predefined options;

e) transmitting the modifications from the user device to the server;

f) processing circuitry at the server receiving the modifications from the user device;

g) processing circuitry at the server applying the received modifications to the source model to create a modified model;

h) processing circuitry at the server subdividing a surface of the modified model to create a high resolution model;

i) processing circuitry at the server modifying the high resolution model by combining it with the internal components portion of the source model, wherein modifying the high resolution model by combining with the internal components portion of the source model includes modifying positioning of the internal components portion in accordance with the received modifications to the control points and based on internal components portion constraint data included in the source model using metadata attached to specific features of the source model; and j) processing circuitry at the server generating print instructions based on the modified high resolution model for manufacture of a customised version of the 3D object.

2. A method as claimed in claim 1, wherein the print instructions are generated via a layer renderer.

3. A method as claimed in claim 1, further including:
automatically controlling a 3D printer using the print instructions.

4. A method as claimed in claim 1, wherein the shell portion comprises the low resolution exterior surface mesh and an interior surface mesh.

5. A method as claimed in claim 4 wherein the modifications are applied to each of the low resolution exterior mesh and the interior surface mesh.

6. A method as claimed in claim 5 wherein the low resolution exterior mesh and the interior surface mesh are combined after the modifications are applied.

7. A method as claimed in claim 1 further including:
generating a stereo-lithography check on the modified high resolution model to ensure that the modified high resolution model has a completed and closed surface.

8. A method as claimed in claim 1 further including:
displaying on another display the modified high resolution model and the source model.

9. A method as claimed in claim 1 wherein the modifications are delimited by constraints.

10. A method as claimed in claim 1 wherein
the model including the received low resolution exterior surface mesh is displayed with a low resolution representation in the graphical user interface provided on the user device.

11. A method as claimed in claim 1, wherein the modifications to the at least some of the control points customize a set of physical features of the source model.

12. A 3D object manufactured by the method as claimed in claim 1.

13. The method as claimed in claim 1, wherein the exterior surface mesh is displayed on the display associated with the user device with a low resolution and without the internal components portion of the source model.

14. A system for manufacturing 3D objects, including:
processing circuitry of a server configured to:
retrieve, from a database, a source model comprising a shell portion and an internal components portion for a 3D object and a plurality of defined control points relating to aspects of the shell portion for the 3D object, wherein the shell portion comprises a low resolution exterior surface mesh including a series of interconnected polygons with the control points relating to vertices of the exterior surface mesh and the internal components portion comprises at least one high resolution mesh having a higher polygon count than the low resolution exterior surface mesh;
transmit, to a user device, the low resolution exterior surface mesh of the shell portion and the control points relating to aspects of the shell portion;
receive, from the user device, user specified modifications to at least some of the control points relating to aspects of the shell portion for the source model, wherein the user specified modifications are correlated to one or more selected predefined options;
apply the received modifications to the source model to generate a modified model;
subdivide, a surface of the modified model to create a high resolution model;
modify the high resolution model by combining it with the internal components portion of the source model, wherein modifying the high resolution model by combining with the internal components portion of the source model includes modifying positioning of the internal components portion in accordance with the received modifications to the control points and based on internal components portion constraint data included in the source model using metadata attached to specific features of the source model to define and apply a set of move and morph operations applied to the internal components portion to obtain a desired shape and size for the internal components portion; and
render print instructions from the modified high resolution model; and
a control unit configured for controlling a 3D printer to create a 3D object from the print instructions.

15. A system as claimed in claim 14, wherein the processing circuitry is further configured for subdividing the modified model to generate a processed model which is used to render the print instructions.

16. A system as claimed in claim 14, wherein the processing circuitry is further configured to render the print instructions by using a layer renderer.

17. A system as claimed in claim 14, wherein
the database is configured for storing a plurality of source models and associated control points, each of the source models comprising a shell portion and an internal components portion.

18. A system as claimed in claim 14 further including:
a communications circuitry;

wherein the processing circuitry is further configured to transmit a representation of the source model and the control points to the user device via the communications circuitry.

19. The system as claimed in claim 14, wherein applying the received modifications to the source model to generate the modified model includes (1) adjusting the vertices of the polygons in the exterior surface mesh of the shell portion based on the received modifications to the source model, and (2) adjusting an interior surface mesh of the shell portion to match the exterior surface mesh by applying the modifications to the interior surface mesh of the shell portion.

20. The system as claimed in claim 19, wherein the exterior surface mesh of the shell portion is combined with the interior surface mesh of the shell portion to form a solid portion by performing an intersection operation on the interior and exterior surface meshes.

21. A non-transitory computer readable storage medium having stored therein instructions, which when executed by processing circuitry of a server cause the server to perform operations comprising:

retrieving, from a database, a source model comprising a shell portion and an internal components portion for a 3D object and a plurality of defined control points relating to aspects of the shell portion for the 3D object, wherein the shell portion comprises a low resolution exterior surface mesh including a series of interconnected polygons with the control points relating to vertices of the exterior surface mesh and the internal components portion comprises at least one high resolution mesh having a higher polygon count than the low resolution exterior surface mesh;

transmitting, to a user device, the low resolution exterior surface mesh of the shell portion and the control points relating to aspects of the shell portion;

receiving, from the user device, user specified modifications to at least some of the control points relating to aspects of the shell portion for the source model, wherein the user specified modifications are correlated to one or more selected predefined options;

applying the received modifications to the source model to generate a modified model;

subdividing a surface of the modified model to create a high resolution model;

modifying the high resolution model by combining it with the internal components portion of the source model, wherein modifying the high resolution model by combining with the internal components portion of the source model includes modifying positioning of the internal components portion in accordance with the received modifications to the control points and based on internal components portion constraint data included in the source model using metadata attached to specific features of the source model to define and apply a set of move and morph operations to be applied to the internal components portion to obtain a desired shape and size for the internal components portion; and rendering print instructions from the modified high resolution model; and controlling a 3D printer to create a 3D object from the print instructions.

* * * * *